(12) United States Patent
Rivoir et al.

(10) Patent No.: US 8,797,046 B2
(45) Date of Patent: Aug. 5, 2014

(54) METHOD OF SHARING A TEST RESOURCE AT A PLURALITY OF TEST SITES, AUTOMATED TEST EQUIPMENT, HANDLER FOR LOADING AND UNLOADING DEVICES TO BE TESTED AND TEST SYSTEM

(75) Inventors: Jochen Rivoir, Magstadt (DE); Markus Rottacker, Stuttgart (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 404 days.

(21) Appl. No.: 12/865,327

(22) PCT Filed: Sep. 18, 2008

(86) PCT No.: PCT/EP2008/007833
§ 371 (c)(1),
(2), (4) Date: Nov. 1, 2010

(87) PCT Pub. No.: WO2010/031415
PCT Pub. Date: Mar. 25, 2010

(65) Prior Publication Data
US 2011/0041012 A1 Feb. 17, 2011

(51) Int. Cl.
*H01H 31/02* (2006.01)
*G01R 31/26* (2014.01)
*G01R 31/319* (2006.01)

(52) U.S. Cl.
CPC .............. *G01R 31/26* (2013.01); *G01R 31/2637* (2013.01); *G01R 31/31908* (2013.01)
USPC .......... 324/555; 324/765.01; 29/741; 29/743; 438/17

(58) Field of Classification Search
CPC ......... H01L 22/14; H01L 22/20; H01L 22/34; H01L 25/0652; H01L 22/00
USPC ............ 324/158.1, 555, 765, 765.01; 29/741, 29/743, 759; 438/17
See application file for complete search history.

(56) References Cited

U.S. PATENT DOCUMENTS

| | | | | | |
|---|---|---|---|---|---|
| 4,749,943 | A | * | 6/1988 | Black | 324/754.16 |
| 4,817,273 | A | * | 4/1989 | Lape et al. | 29/741 |
| 5,025,205 | A | | 6/1991 | Mydill et al. | |
| 6,806,725 | B2 | * | 10/2004 | Tsui et al. | 324/750.23 |
| 6,903,567 | B2 | * | 6/2005 | Chung et al. | 324/757.01 |
| 8,600,309 | B2 | * | 12/2013 | Chang et al. | 455/67.11 |
| 2004/0061491 | A1 | | 4/2004 | Chung et al. | |
| 2005/0261856 | A1 | | 11/2005 | Kushnick et al. | |
| 2009/0013218 | A1 | * | 1/2009 | Rousseau et al. | 714/48 |

FOREIGN PATENT DOCUMENTS

WO 2008014827 A1 2/2008
WO 2010031415 A1 3/2010

OTHER PUBLICATIONS

International Search Report, PCT/EP2008/007833, Sep. 18, 2008.*

* cited by examiner

*Primary Examiner* — Patrick Assouad
*Assistant Examiner* — Sean Curtis

(57) ABSTRACT

A method of sharing a test resource at a plurality of test sites executes respective test flows at the plurality of test sites with an offset in time, the respective test flows accessing the test resource at a predetermined position in the test flow.

11 Claims, 4 Drawing Sheets

US 8,797,046 B2

METHOD OF SHARING A TEST RESOURCE AT A PLURALITY OF TEST SITES, AUTOMATED TEST EQUIPMENT, HANDLER FOR LOADING AND UNLOADING DEVICES TO BE TESTED AND TEST SYSTEM

BACKGROUND OF THE INVENTION

Embodiments of the invention concern a method of sharing a test resource at a plurality of test sites testing a plurality of devices, an automated test equipment, a handler for loading and unloading devices to be tested to/from a plurality of test sites of an automated test equipment, and a system for testing a system for testing a plurality of devices.

Components, for example memory elements and integrated circuits (IC), need to be tested. During testing these devices under test (DUTs) are exposed to various types of stimulus signals, and responses from such devices are measured, processed and compared to an expected response. Such testing may be carried out by automated test equipment (ATE) which usually performs such tasks according to a device-specific test program or test flow.

Examples for such automated test equipment are the Verigy V93000 series and the Verigy V5000 series, the first being a platform for testing system-on-a-chip, system-on-a-package and high-speed memory devices. The latter is for testing memory devices including flash memory and multi-chip packages at wafer sort and final test.

Such automated test equipment may comprise multiple sites, each receiving a device under test thereby allowing the testing of a plurality of devices at the same time. Such automated test equipment may comprise a device handler having a gripping mechanism for simultaneously placing a plurality of devices to be tested into the test sites and for removing the devices from the test sites after the test is completed. The automated test equipment provides for respective resources allowing the testing of the devices, and in a multi-site test, the respective ATE resources are accessible to all sites. While there are resources which are provided at each site, there are also resources in an automated test equipment, such as RF resources for RF measurements and the like, which are expensive but which are used only during short periods of a test program or test flow executed at a respective test site. In one conventional approach, at each test site of an automated test equipment, such a specific resource, for example, a resource for performing RF measurements, may be provided which, however, is quite expensive. Alternatively, a single resource may be provided in the automated test equipment and resource multiplexing in common test flows executed at the respective test site might be performed. However, this adds to test time overhead. Also, the test flows or test programs may be modified to generate circular test flows which are executed in such a manner that those portions of a test flow accessing the specific resources do not overlap while simultaneously executing the test flows at the respective test sites, however, this involves the development of different test flows per site which increases the complexity of the test preparation.

SUMMARY

According to an embodiment, a method of sharing among a plurality of test sites a specific test resource for executing a specific test at a device may have the steps of: executing respective test flows at the plurality of test sites with an offset in time, wherein the respective test flows access the test specific resource at a predetermined position in the test flow to execute a specific test at a device held in a test site.

Another embodiment may have a computer-readable medium including computer executable instructions for carrying out the method of sharing among a plurality of test sites a specific test resource for executing a specific test at a device, the method having the steps of: executing respective test flows at the plurality of test sites with an offset in time, wherein the respective test flows access the test specific resource at a predetermined position in the test flow to execute a specific test at a device held in a test site, when executing the instructions on a computer.

According to another embodiment, an automated test equipment may have: a plurality of test sites, each test site being configured to receive a device to be tested; a specific test resource configured to be selectively connected to one of the test sites and to execute a specific test at a device held in a test site; and a tester configured to start execution of respective test flows at the test sites with an offset in time, wherein the respective test flows includes a portion accessing the specific test resource, the offset in time being selected such that portions in the test flows accessing the specific test resource do not overlap, and wherein the tester is configured to connect the specific test resource to the test site at which the portion accessing the specific test resource is currently executed.

According to another embodiment, a test system for testing a plurality of devices may have: an automated test equipment that may have: a plurality of test sites, each test site being configured to receive a device to be tested; a specific test resource configured to be selectively connected to one of the test sites and to execute a specific test at a device held in a test site; and a tester configured to start execution of respective test flows at the test sites with an offset in time, wherein the respective test flows include a portion accessing the specific test resource, the offset in time being selected such that portions in the test flows accessing the specific test resource do not overlap, and wherein the tester is configured to connect the specific test resource to the test site at which the portion accessing the specific test resource is currently executed; and a handler for loading and unloading devices to be tested to/from a plurality of test sites of an automated test equipment, the handler including: a mechanism configured to load devices to be tested to respective test sites of an automated test equipment and configured to unload devices tested from the test sites; and a controller configured to control the mechanism to load the devices with an offset in time.

BRIEF DESCRIPTION OF THE DRAWINGS

Embodiments of the invention will be described in the following with reference to the accompanying drawings in which.

DETAILED DESCRIPTION OF THE INVENTION

Figure 1:
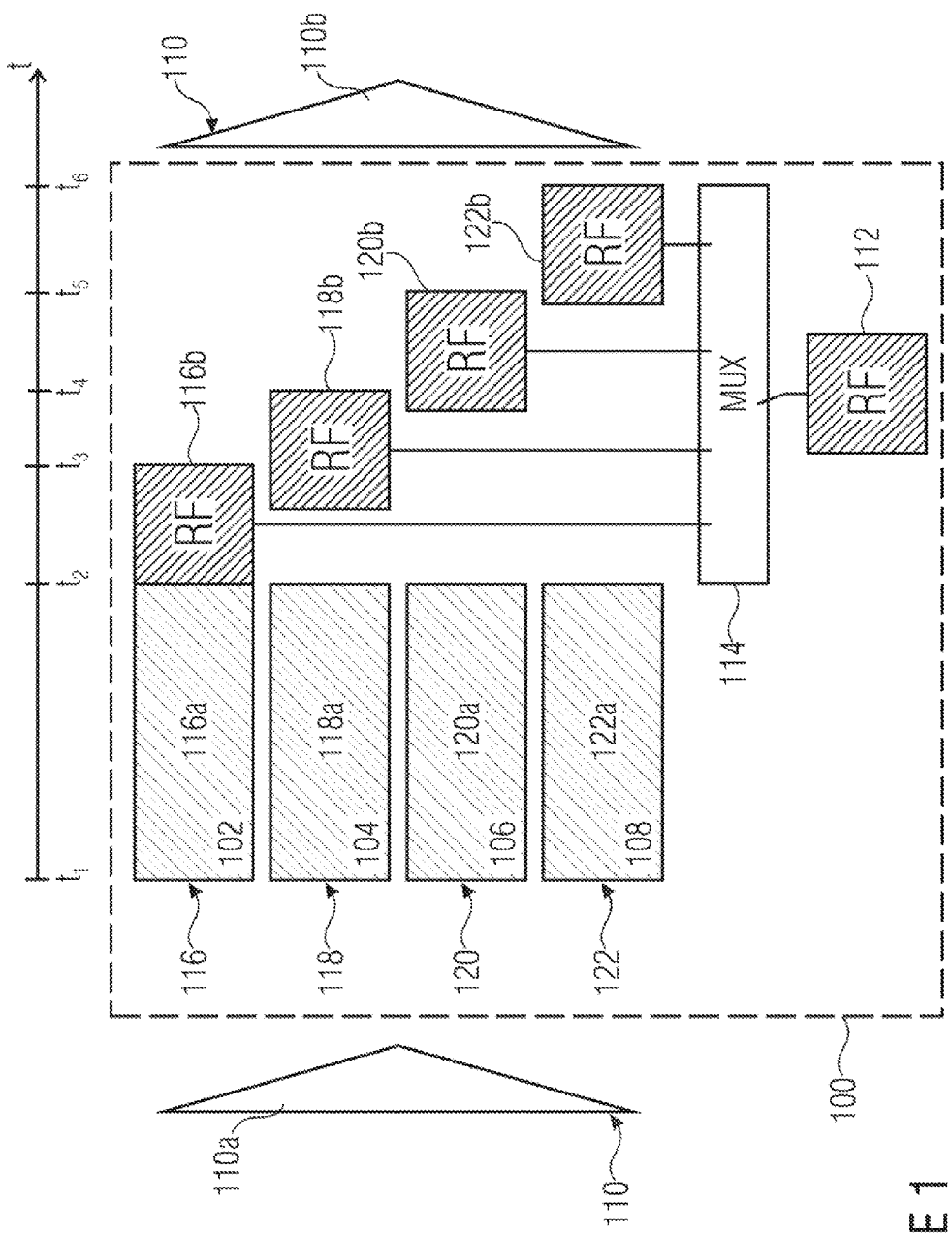
FIG. 1 shows a schematic view illustrating a first conventional method for sharing a specific test resource by resource multiplexing.

FIG. 1 is a schematic view illustrating a conventional approach for testing a plurality of devices using an automated test equipment 100 as it is schematically shown in FIG. 1.

The automated test equipment 100 comprises a plurality of test sites 102, 104, 106 and 108. It is noted that in FIG. 1 an automated test equipment is shown having four test sites. Further, a handling mechanism 110 is provided for loading 110a devices to be tested to the respective test sites 102 to 108 and for unloading 110b devices tested from the respective test sites 102 to 108.

The automated test equipment comprises a specific resource 112, for example, a RF resource for executing respective RF measurements at the devices held in the respective test sites 102 to 108. Further, a multiplexer 114 is provided for selectively switching the resource 112 to the respective test sites 102 to 108. At the respective test sites 102 to 108, the automated test equipment 100 has loaded respective test flows 116 to 122 which may be the same or which may be different. Each of the test flows comprises a first portion 118a to 122a and a second portion 118b to 122b. The first portion 116a to 122a of the respective test flows 116 to 122 executes respective tests at the devices under test provided at the respective test sites 102 to 108 using test resources wherein each site 102 to 108 comprises respective test resources so that the portions 116a to 122a of the tests can be carried out in parallel. The second portions 116b to 122b of the respective test flows 116 to 122 access the specific test resource 112, for example, for executing RF tests with regard to the devices provided at the respective test site. Since the automated test equipment 100 comprises only a single specific test resource 112, the second portions 116b to 122b of the respective test flows 116 to 122 cannot be executed in parallel.

Rather, the portions 116b to 122b of the test flows 116 to 122 access the test resource 112 in a sequential manner and the test recourse 112 is connected via the multiplexer 114 to one of the test sites 102 to 108 and, more specifically, to that test site at which currently the second portion of the test flow 116 to 122 is executed.

More specifically, at a time $t_1$ the handler 110 loads 110a devices to be tested into the test sites 102 to 108 and the automated test equipment 100 starts executing the first portion 116a to 122a of the respective test flows or test programs 116 to 122 until the time $t_2$. During the time period between $t_1$ and $t_2$, testing of the devices is done in parallel, as outlined above, as all test flows access resources provided at each test site 102 to 108. At the time $t_2$, the parallel testing is completed and now access is made to the specific resource 112 provided only once for all test sites 102 to 108. During the time period between $t_2$ and $t_3$ the first program flow 116 executed at site 102 executes its second portion 116b. At that time, the specific resource 112 is connected via multiplexer 114 to site 102 currently executing that part of the test flow accessing the RF resource 112. At the time $t_3$ testing at the first site 102 is completed and testing at the second site 104 is started by executing the second portion 118b of test flow 118. At this time, the resource 112 is connected via the multiplexer 114 to the second site 104 so that the second portion 118b may access the resource 112. In a similar manner, between times $t_4$ and $t_5$ and between $t_5$ and $t_6$, the second portions 120b and 122b of the test flows 120 and 122 at test sites 106 and 108 are executed.

It is noted that FIG. 1 shows an example where a single test resource 112 is provided, however, it might well be that, for example, two specific test resources 112 are provided which are shared among two of the four test sites. Also, more than the four test sites might be provided. Also, test flows might be slightly different, for example, the respective portions 116b to 122b accessing the specific resource 112 might be provided at the beginning of the test or somewhere in the middle of the test flow.

At time $t_6$ all devices arranged at the sites 102 to 108 are tested and handler 110 is again activated to unload 110b the tested devices from the system shown in FIG. 1. The process is then repeated, i.e., new devices to be tested are loaded 110a to the now empty sites 102 to 108 and test flow execution is carried out as specified above. While the approach described in FIG. 1 reduces the costs associated with testers providing at each site a specific test resource 112, it is readily apparent that the reduced costs are achieved by an increase in test time or by the addition of test time overhead. To be more specific, despite the fact that testing of the device at the first site 102 is already completed at time $t_3$, all devices are removed from the tester together at the time $t_6$. Thus, during the time period $t_3$ to $t_6$, the test site 102 is idle. Thus, it is, for example, not possible to replace a device at site 102 after the test is complete by a new device, rather, it is to be waited until all devices are tested.

Figure 2:
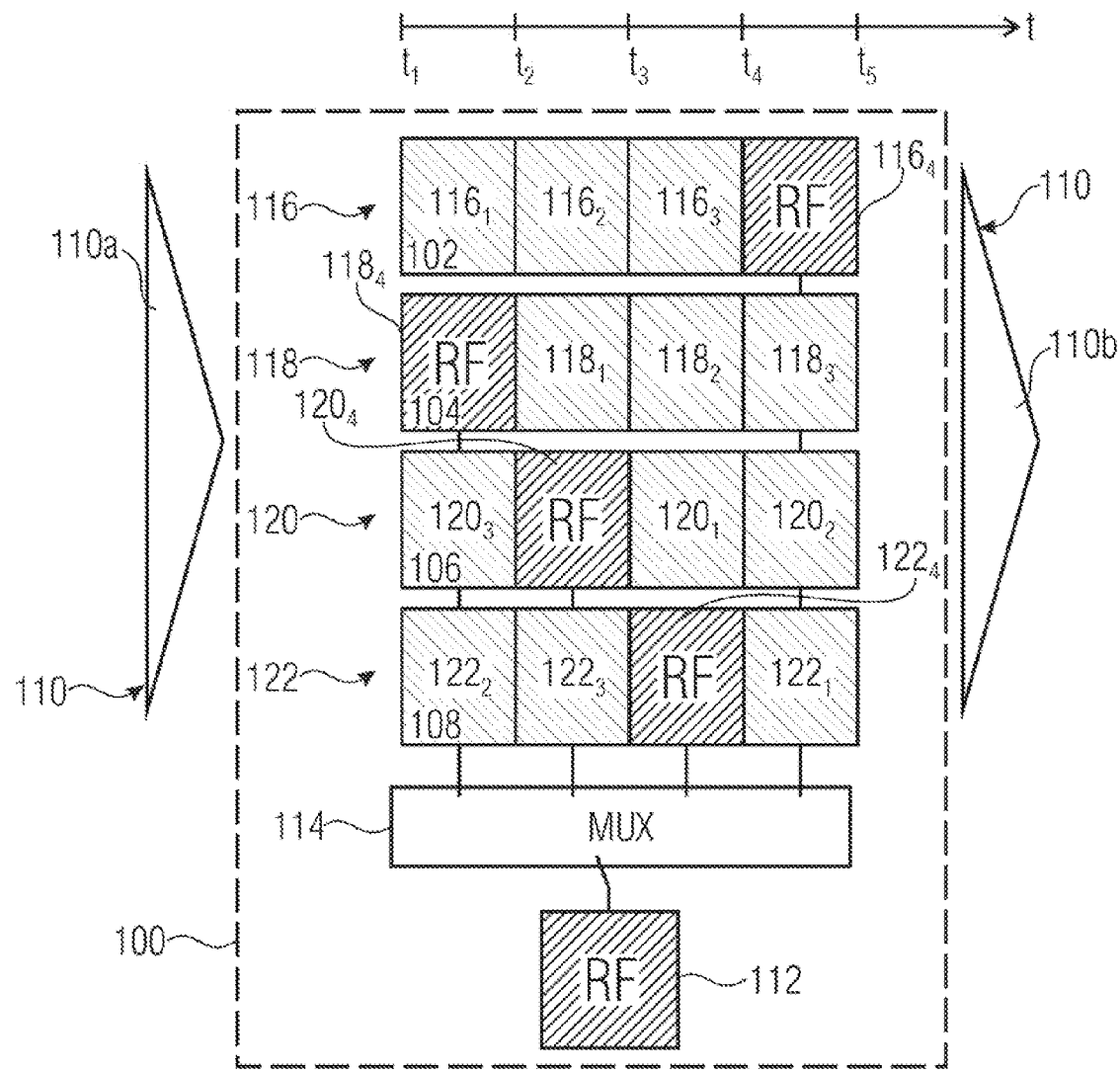
FIG. 2 shows a schematic view illustrating a second conventional method for sharing a specific test resource by using circular test flows.

FIG. 2 shows a schematic view of a second conventional approach for sharing a specific test resource, however, rather than using a multiplexed approach, the conventional approach shown in FIG. 2 uses circular test flows. In FIG. 2, those elements having the same functionality as corresponding elements described in FIG. 1 are associated with the same reference signs.

As can be seen from FIG. 2, rather than using a test flow at the respective test sites 102 to 108 having a first portion and a second portion, in accordance with the approach shown in FIG. 2, each test flow is segmented into four portions $116_1$ to $116_4$, $118_1$ to $118_4$, $120_1$ to $120_4$ and $122_1$ to $122_4$. The respective portions $116_4$ to $122_4$, are those portions of the respective test flows 116 to 122 accessing the specific resource 112. The respective portions of the test flows are arranged in such a manner that when testing in parallel at the respective test sites 102 to 108, the portions are arranged in such a manner that those portions $116_4$ to $122_4$ accessing the specific device 112, do not overlap. Thus, during the time period of $t_1$ to $t_4$, at the first site 102, the portions $116a$ to $116_3$ accessing test resources associated with the test site 102 are executed and during the time period between $t_4$ and $t_5$, the single resource 112 is accessed by portion $116_4$. At the second test site 104, the resource 112 is accessed at the time period between $t_1$ and $t_2$, at the third test site 106, the resource 112 is accessed during the time period $t_2$ and $t_3$, and at the fourth test site 122, the resource 112 is accessed during the time period between $t_3$ and $t_4$. Again, the multiplexer 114 connects the resource 112 selectively to those test sites currently executing the test flow portion $116_4$ to $122_4$ accessing the test source 112.

When compared to the approach in FIG. 1, it is to be seen that test execution is faster and at the time $t_5$ all devices were tested and can be removed by handler 110, so that no idle times at the respective test sites exist. However, as can also be seen from FIG. 2, the respective test flows to be executed at the sites 102 to 108 are quite complex, i.e., test program complexity is greatly increased, and becomes even more complicated when assuming that conventional automated test equipment comprises many more test sites than those shown in the example of FIG. 2. In other words, with increasing number of test sites, the test program complexity increases accordingly.

To avoid the problems associated with prior art approaches, such as providing the expensive and rarely used specific resources 112 at each test site of an automated system, the additional test time overhead as described with regard to FIG. 1, or the test program complexity as described in the example of FIG. 2, embodiments of the invention suggest a novel approach for sharing a specific test resource among a plurality of test sites of an automated test equipment. Embodiments of the invention call the approach a "pipelined test flow". As will be discussed in further detail below, embodiments of the invention overcome the above problems of prior art approaches by shifting the times of loading and unloading the devices to the tested into the test sites, by shifting the execution of multiple site test flows (the same test flows or different test flows at the respective test sites) in time, and by sequentially sharing test resources. Further, the invention provides an automated test equipment with the ability to execute the test site flows shifted in time to enable a pipelined test flow execution. Also, embodiments of the invention provide a handler with the ability to load and unload parts into sites in a time-shifted way.

Figure 3:
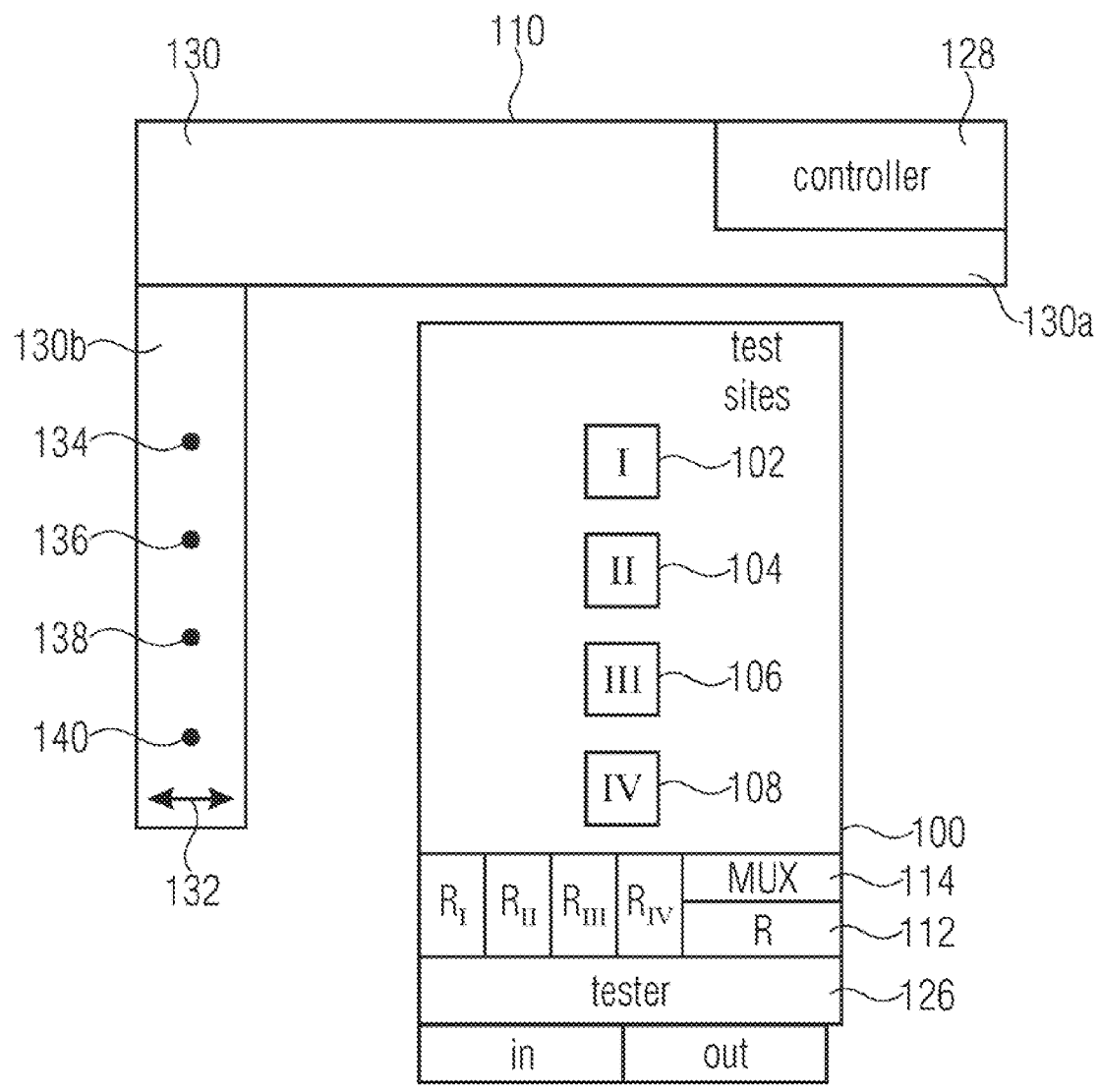
FIG. 3 shows a block diagram of a test system in accordance with embodiments of the invention.

FIG. 3 is a block diagram of a test system in accordance with embodiments of the invention. The test system 124 comprises an automated test equipment 100 operating in accordance with the principles of embodiments of the invention. The automated test equipment comprises four test sites 102 to 108, respective resources $R_I$, $R_{II}$, $R_{III}$ and $R_{IV}$, each of the just-mentioned resources being associated with a respective one of the test sites 102 to 108. More specifically, resources $R_I$ belong to test sites 102, resources $R_{II}$ belong to test site 104, resources $R_{III}$ belong to test site 106 and resources $R_{IV}$, belong to test site 108. Also, the specific resource 112 to be shared among all test sites 102 to 108 is shown together with its associated multiplexer 114. The automated test equipment also comprises a tester 126 receiving via an input IN respective signals and out-putting via the output OUT respective test output signals. The tester provides at the respective test sites 102 to 108, the test flows or test programs to be executed with regard to devices to be tested. The test programs may be the same or may be different at the respective test sites. In accordance with embodiments of the invention, the tester 126 of the automated test equipment is configured to start executing the respective test flows at the different test sites 102 to 108 with an offset in time, as will be described in further detail below.

The system 124 further comprises the handler 110 comprising a controller 128 and a mechanism 130 for loading/unloading devices to the automated test equipment 100, more specifically to/from the respective test sites 102 to 108. A mechanism 130 comprises a first part 130a along which a gripping mechanism 130b may be moved (see arrow 132) for allowing loading/unloading devices to be tested and devices which were tested, respectively, via respective grippers 134 to 140. In accordance with embodiments of the invention, the controller 128 of the handler 118 is configured such that the gripping mechanism 130b loads/unloads the devices to the respective test sites 102 to 108 of the automated test equipment 100 with an offset in time, as will also be described in further detail below.

Figure 4:
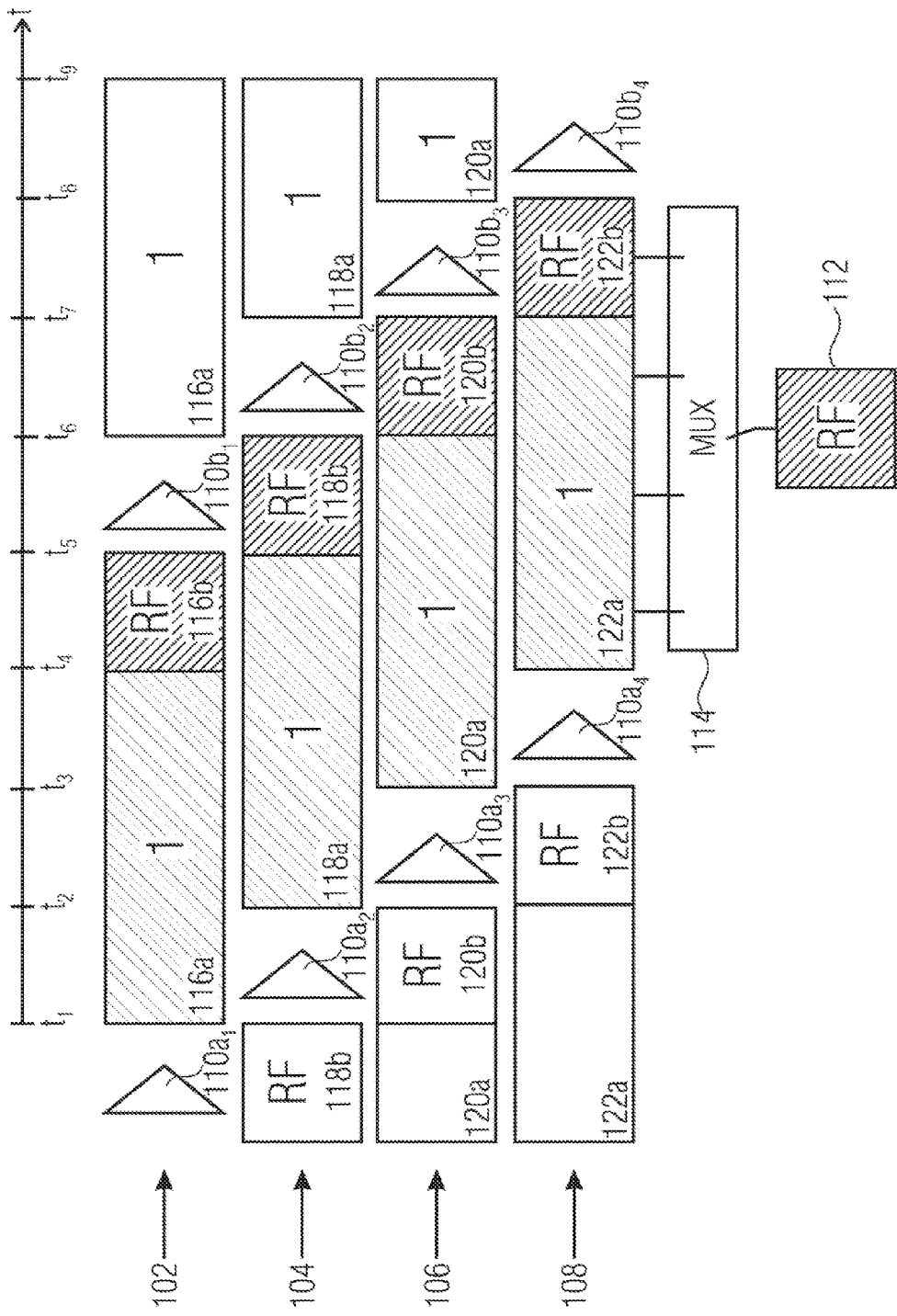
FIG. 4 shows a schematic view illustrating a method for sharing a test resource by pipelined test flows in accordance with embodiments of the invention.

FIG. 4 illustrates a schematic view of a method according to embodiments of the invention. In FIG. 4, the respective actions taken by the handler are indicated by reference signs $110a_1$ to $110a_4$ and $110b_1$ to $110b_4$. The respective test flows are indicated by reference signs 116 to 122. The portions 116a to 122a accessing resources associated with the respective test sites are indicated as well as portions 116b to 122b accessing the single resource 112 via multi-plexer 114 are indicated.

FIG. 4 shows a part of the operation of a test system as is shown in FIG. 3 and the approach in accordance with embodiments of the invention will be described below. In accordance with the principles of embodiments of the invention, the times of loading $110a_1$ to $110a_4$ and unloading $110b_1$ to $110b_4$ of the devices to be tested at the respective test sites 102 to 108 are shifted in time. As can be seen, at time $t_1$ handler 110 loads $110a_1$ a device to test site 102.

Loading of devices to the other test sites 104 to 108 is shifted in time, so that at time $t_2$ a device is loaded $110a_2$ to site 104, at time $t_3$ a device is loaded $110a_3$ to site 106 and at time $t_4$ a device is loaded $110a_4$ to site 108.

At the respective sites 102 to 108, the test programs or test flows 116 to 122 are provided by the tester of the automated test equipment, however, in accordance with the principles of embodiments of the invention, executing the respective test flows at the different sites 102 to 108 is shifted in time in a manner as is shown in FIG. 4. More specifically, start of the respective test flow portions 116a to 122a is shifted in a similar manner as is the loading of the devices so that the test flow at site 102 starts at time the test flow at site 104 starts at time $t_2$, the test flow at site 106 starts at time $t_3$ and the test flow at site 108 starts at time $t_4$. The portions 116b to 122b within the respective test flows are arranged in such a manner that due to the time difference, when starting the execution of the respective test flows at the test sites 102 to 108, the portion's 116b to 122b are executed in a non-overlapping manner. This allows using the single resource 112 and coupling same to the respective test sites 102 to 108 via the multiplexer 114 at those times at which at the respective test sites the test flow portion 116b to 122b accessing element 112 are executed. More specifically, during the time period between the $t_4$ and $t_5$, the single resource 112 is coupled to the first site 102, during the time period between $t_5$ and $t_6$, the resource 112 is coupled to the second site 104, during the time period between $t_6$ and $t_7$, the resource 112 is coupled to the third site 106 and during the time period between and is the resource 112 is coupled to site 108.

As outlined above, the handler places the respective devices to the different sites with an offset in time and, in a similar manner, is able to remove or unload tested devices from the respective sites with an offset in time. The handler is configured in such a manner that devices can be removed from the sites once a test is completed. More specifically, following the test complete $t_5$, handler 110 removes $110b_1$ the tested device from site 102 and places a new device to be tested at site 102, so that the test flow can again be executed at time $t_6$. In a similar manner, removal of tested devices and loading of new devices to be tested is done at the other sites 104 to 108. More specifically, a time $t_6$ a tested device is removed $110b_2$ from site 104 and a new device to be tested is inserted so that test flow execution can again be started at time $t_7$. At time $t_7$, a tested device is removed from test site 106 and a new one is inserted, thereby allowing execution of the test flow at site 106 at time $t_8$ again. In a similar manner, at time $t_8$ a tested device from site 108 is removed $110b_4$ and a new device is loaded thereby allowing starting execution of the test flow at site 108 again at time $t_9$.

Thus, in accordance with the principles of embodiments of the invention, it is not necessary to provide expensive resources, like an RF resource 112, at each of the test sites 102 to 108 of an automated test equipment, thereby allowing a reduction in costs. Also, the problems of test flow complexity and test time overhead are avoided by allowing the handler to place respective devices to the test site with an offset in time and remove the respective devices which were tested from the test sites also with an offset in time, thereby avoiding idle times at the respective test sites 102 to 108 as new devices can already be loaded into the test site and testing can be started. Also, by allowing the automated test equipment to start execution of the respective test programs in a time shifted way, the use of a common resource 112 for respective portions 116b to 122b of the test program is allowed.

In the embodiment described in FIG. 4, a test system is assumed similar to the one shown in FIG. 3, i.e., a test system having an automated test equipment with four test sites and four grippers of the handler. The invention is not limited to such embodiments, rather the automated test equipment may have less test sites or more test sites. The gripping mechanism of the handler 110 may have a corresponding number of gripping elements allowing loading/unloading of devices to the respective test sites. Alternatively, the handler may be configured with less grippers which are controlled in such a manner that the grippers sequentially receive devices to be tested and place the devices, e.g. one or more devices with subsequent moves, at the respective sites.

Also, the test flow does not require the specific portion 116b to 122b accessing the single device 112 to be positioned towards the end of the test flow, rather any position within the test flow is possible as long as the staggered execution of the test flows in the respective test sites does result in an overlap of those portions of the test flows accessing the single device 112. While FIG. 4 shows an embodiment in which each test site executes the same test flow, it is noted that also different test flows can be provided with the respective test sites 102 to 108.

In addition, the invention is not limited to embodiments in accordance with which only a single specific resource 112 is to be shared among a plurality of test sites, rather; it might well be that a plurality of specific test resources 112 are provided, each being shared between a subset of test sites. For example, in FIG. 4, a second resource may be provided wherein the first resource is shared among sites 102 and 104 and a second one is shared among sites 106 and 108.

While embodiments of the invention described above show starting the execution of respective test flows at subsequent test sites, it is noted that the test flows may be started in a non-sequential manner. For example, when looking at FIG. 4, it is possible to start loading and executing the test flow at test site 102 at time $t_2$ or a later time and to start loading and executing the test flow at site 106 at time $t_1$.

Also the invention is not limited to embodiments in which all of the test sites share one or more specific resources. For example, test sites 102 and 104 may execute the same or different test flows requiring access to resource 112 while the remaining test sites do not require access to resource 112 when testing the device placed here. In this situation, the device 112 is only shared among sites 102 and 104, so that only loading/unloading of devices to be tested and starting execution of the test flows at sites 102 and 104 is shifted in time, while, for example, testing at sites 106 and 108 may start concurrently with testing at site 102 or at any desired starting time.

Further, it is noted that the above described method, in accordance with embodiments of the invention, can be implemented in hardware or in software. In addition, the implementation can be in a digital storage medium, for example a disc or a CD comprising electronically readable control signals, which can act together with a programmable computer system, for executing the method according to embodiments of the invention. Generally, the invention is also a computer program product having a program code for executing the method according to embodiments of the invention being stored on a machine readable carrier and executed when the computer program product runs on a computer. In other words, the invention is also a computer program having program codes for carrying out the method when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method comprising:
executing a test flow including a first portion and a second portion at each of a plurality of test sites of an automated test equipment, with a different offset in time for execution of the second portion at each of the plurality of test sites,
wherein the second portion of the test flow executing at each respective test site accesses a test specific resource shared between the plurality of test sites to execute a specific test at a respective device held in each of the plurality of test sites sequentially as a result of the different offset in time for execution of the second portion at each of the plurality of test sites, while the first portion of the test flow executing at each respective test site accesses one or more other resources each associated with each of the plurality of test sites to execute one or more other tests at the respective device held in each of the plurality of test sites.

2. The method of claim 1, further comprising:
loading the device to be tested to the respective test sites with an offset in time; and
unloading the device tested from the respective test sites with an offset in time.

3. The method of claim 2, further comprising:
repeating loading, executing and unloading at each test site.

4. The method of claim 1, wherein at the plurality of test sites the same test flows or different test flows are executed.

5. The method of claim 1, wherein at the plurality of test sites the same devices or different devices are tested.

6. A non-transitory computer-readable medium comprising computer executable instructions for carrying out the method of sharing among a plurality of test sites a specific test resource for executing a specific test at a device, the method comprising:
executing a test flow including a first portion and a second portion at each of the plurality of test sites a different offset time for execution of the second portion at each of the plurality of test sites,
wherein the second portion of the test flow executing at each test site accesses the test specific resource shared between the plurality of test sites to execute a specific test at a device held in each of the plurality of test sites sequentially as a result of the different offset in time for execution of the second portion at each of the plurality of test sites, while the first portion of the test flow executing at each respective test site access at least one other resource associated with each of the plurality of test sites to execute tests at the device in each of the plurality of test sites,
when executing the instructions on a computer.

7. An automated test equipment, comprising:
a plurality of test sites, each test site being configured to receive a device to be tested;
a specific test resource configured to be selectively connected to each of the plurality of test sites with a respective different offset in time and to execute a specific test at a device held in the respective test site with the respective different offset in time; and
a tester configured to execute respective test flows at the plurality of test sites to test a function of each device with the respective different offset in time when the test flows start executing at each respective test site, wherein the respective test flows comprise a first portion accessing test resources associated with each of the plurality of test sites and a second portion accessing the specific test resource, the respective different offset in time being selected such that execution of the second portion in the test flows accessing the specific test resource do not overlap between the plurality of test sites, and wherein the tester is configured to connect the specific test resource to the test site at which the second portion accessing the specific test resource is currently executed.

8. The automated test equipment of claim 7, wherein the tester is configured to start at the test sites execution of the same or different test flows.

9. A test system for testing a plurality of devices, the test system comprising:
   an automated test equipment, comprising:
   a plurality of test sites each test site being configured to receive a device to be tested:
   a specific test resource configured to be selectively connected to each of the plurality of test sites with a respective different offset in time and to execute a specific test at a device held in the respective test site with the respective different offset in time; and
   a tester configured to execute respective test flows at the plurality of test sites to test a respective function of each device with the respective different offset in time when the test flows starts executing at each respective test cite, wherein the respective test flows comprise a first portion accessing test resources associated with each of the plurality of test sites and a second portion accessing the specific test resource, the respective different offset in time being selected, such that execution of the second portion in the test flows accessing the specific test resource do not overlap between the plurality of test sites, while one or more other portions access other test resources in parallel at the plurality of test sites, and wherein the tester is configured to connect the specific test resource to the test site at which the second portion accessing the specific test resource is currently executed; and a handler for loading and unloading devices to be tested to/from a plurality of test sites of an automated test equipment, the handler comprising:
   a mechanism configured to load devices to be tested to respective test sites of an automated test equipment and configured to unload devices tested from the test sites; and
   a controller configured to control the mechanism to load the devices with the respective different offset in time.

10. The test system of claim 9, wherein the controller further controls the mechanism to unload the devices tested with the respective different offset in time.

11. The test system of claim 9, wherein the mechanism comprises a gripper.

* * * * *